(12) United States Patent
Tran et al.

(10) Patent No.: US 7,460,040 B1
(45) Date of Patent: Dec. 2, 2008

(54) HIGH-SPEED SERIAL INTERFACE ARCHITECTURE FOR A PROGRAMMABLE LOGIC DEVICE

(75) Inventors: Thungoc M. Tran, San Jose, CA (US); Yu Xu, Palo Alto, CA (US); Kwong-Wen Wei, Sunnyvale, CA (US); Sergey Shumarayev, Los Altos Hills, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 11/754,670

(22) Filed: May 29, 2007

(51) Int. Cl.
*H03M 9/00* (2006.01)
(52) U.S. Cl. ...................... 341/100; 375/354
(58) Field of Classification Search .............. 341/100, 341/101; 375/355, 354
See application file for complete search history.

(56) References Cited

U.S. PATENT DOCUMENTS

| | | | |
|---|---|---|---|
| 6,269,137 B1 * | 7/2001 | Colella et al. ............... | 375/355 |
| 6,724,328 B1 | 4/2004 | Lui et al. | |
| 7,138,837 B2 * | 11/2006 | Venkata et al. ............. | 327/152 |
| 7,236,553 B1 * | 6/2007 | Choi et al. .................. | 375/355 |
| 7,340,021 B1 * | 3/2008 | Churchill et al. ............ | 375/354 |

* cited by examiner

*Primary Examiner*—Peguy JeanPierre
(74) *Attorney, Agent, or Firm*—Ropes & Gray LLP; Jeffrey H. Ingerman

(57) ABSTRACT

A high-speed serial interface for a programmable logic device includes a plurality of features to handle the various issues that may arise with data rates over 1 Gbps and particularly over 1.25 Gbps. Those features may include dynamic phase alignment to control clock-data skew, data realignment (e.g., bit slip circuitry) to account for channel-to-channel skew, full-duplex serializer and deserializer, out-of-range frequency support for low frequencies, and a soft-CDR mode.

32 Claims, 3 Drawing Sheets

HIGH-SPEED SERIAL INTERFACE ARCHITECTURE FOR A PROGRAMMABLE LOGIC DEVICE

BACKGROUND OF THE INVENTION

This invention relates to a high-speed serial interface, especially in a programmable logic device (PLD), which may operate at different data rates.

It has become common for PLDs to incorporate high-speed serial interfaces to accommodate high-speed (i.e., greater than 1 Gbps) serial input/output (I/O) standards. Many of these standards can operate at more than one clock rate. Moreover, under such standards, it is common not to send a separate clock signal with the data, but rather for the clock to be recovered from the data. In such cases, even after clock-data recovery (CDR) circuitry locks onto the recovered clock, it may be necessary to control clock-data skew by aligning the phase of the data and of the clock. However, there may be conditions under which the clock cannot be recovered or is outside the normal range of operation of the interface. These conditions are even more likely in a programmable logic device (PLD) where the particular application to which a user may put the device, and the interface, cannot be known at the time of manufacture.

In addition, such interfaces usually operate serially, but the device may operate internally in parallel, meaning that the interface must be able to convert between serial and parallel data, and to correct data word misalignment (i.e., errors in designating the bit boundaries between data words) during such conversions. And parallel different data on different lines may arrive at the receiver at different times, so that not all data that belong together are captured in the same clock cycle.

Moreover, these conditions arise more frequently as data rates continue to increase to 1.25 Gbps and above. As data rates exceed 1 Gbps, the window of time for sampling the data becomes smaller, resulting in increased jitter. Board skew and supply variations (e.g., due to temperature) become more significant as unit intervals become smaller than 1 ns.

System designers—particularly designers of systems for programmable logic devices—must keep all of these issues in mind in their designs to maintain signal accuracy and integrity. Some of the techniques that designers must rely on include constraints on integrated circuit and printed circuit board materials, and provision of extra components to reduce the occurrence and/or effects supply and temperature fluctuations.

It would be desirable to be able to provide, in a high-speed serial interface, particularly in a PLD, that can handle a wide range of situations that might affect clock and data accuracy and integrity.

SUMMARY OF THE INVENTION

The present invention provides a high-speed serial interface, particularly for a PLD, that can handle a wide range of situations that might affect clock and data accuracy and integrity. A high-speed serial interface in accordance with the present invention provides a solution for full-duplex data transfer that satisfies the requirement of various protocols, including, but not limited to, SPI4.2, Rapid IO, Utopia 4, SFI4, Gigabit Ethernet and Serial Gigabit Media Independent Interface (SMGII).

The invention combines a number of different features to handle the various issues that may arise with data rates over 1 Gbps and particularly over 1.25 Gbps. Those features may include dynamic phase alignment to control clock-data skew, data realignment (e.g., bit slip circuitry) to account for channel-to-channel skew, full-duplex serializer and deserializer, out-of-range frequency support for low frequencies, and a soft-CDR mode.

Thus, in accordance with the present invention there is provided a serial data interface for use with a programmable logic device. The serial data interface is adapted to receive and deserialize a serial data signal, and includes a clock source that provides a clocking signal having a plurality of phases. A dynamic phase alignment module operates on serial data input to the interface and on the plurality of phases of the clocking signal, to align the serial data with one of those phases of the clock signal to which it is closest in phase, and to provide a phase-aligned data signal and to output that one of the phases as a phase-aligned clock signal. A clock tree module derives a data clock using the clocking signal. Serial data processing circuitry deserializes the data signal based on an input clock signal. A clock selector selects one of the data clock and the phase-aligned clock signal as the input clock signal.

In another embodiment, the dynamic phase alignment module operates at a lower clock rate than the serial data processing circuitry and the serial data interface further includes clock dividing circuitry on an output of the clock source that divides each phase of the clocking signal by a division factor for use by the dynamic phase alignment module.

A programmable logic device incorporating the serial interface also is provided.

BRIEF DESCRIPTION OF THE DRAWINGS

The above and other advantages of the invention will be apparent upon consideration of the following detailed description, taken in conjunction with the accompanying drawings, in which like reference characters refer to like parts throughout, and in which.

DETAILED DESCRIPTION OF THE INVENTION

The present invention combines serializer-deserializer functions with dynamic phase alignment functions in a single high-speed interface to provide a single interface with a number of features to cope with the various challenges, such as those described above, posed by high-speed serial communications, particularly in a programmable logic device, and particularly above 1 Gbps (especially above 1.25 Gbps).

Figure 3:
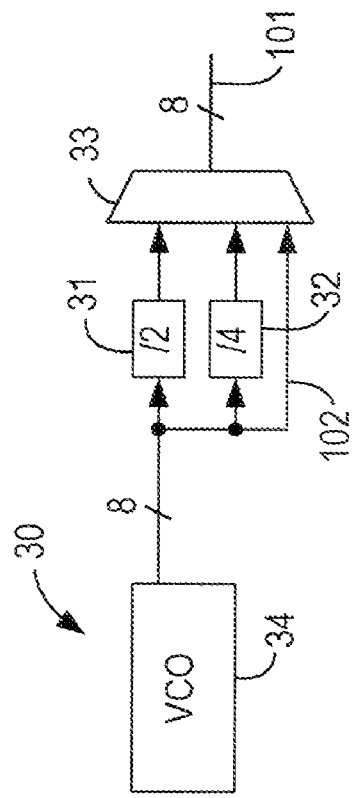
FIG. 3 is a schematic representation of a clock divider according to an embodiment of the present invention.

The invention will now be described with reference to FIGS. 1-3.

Figure 1:
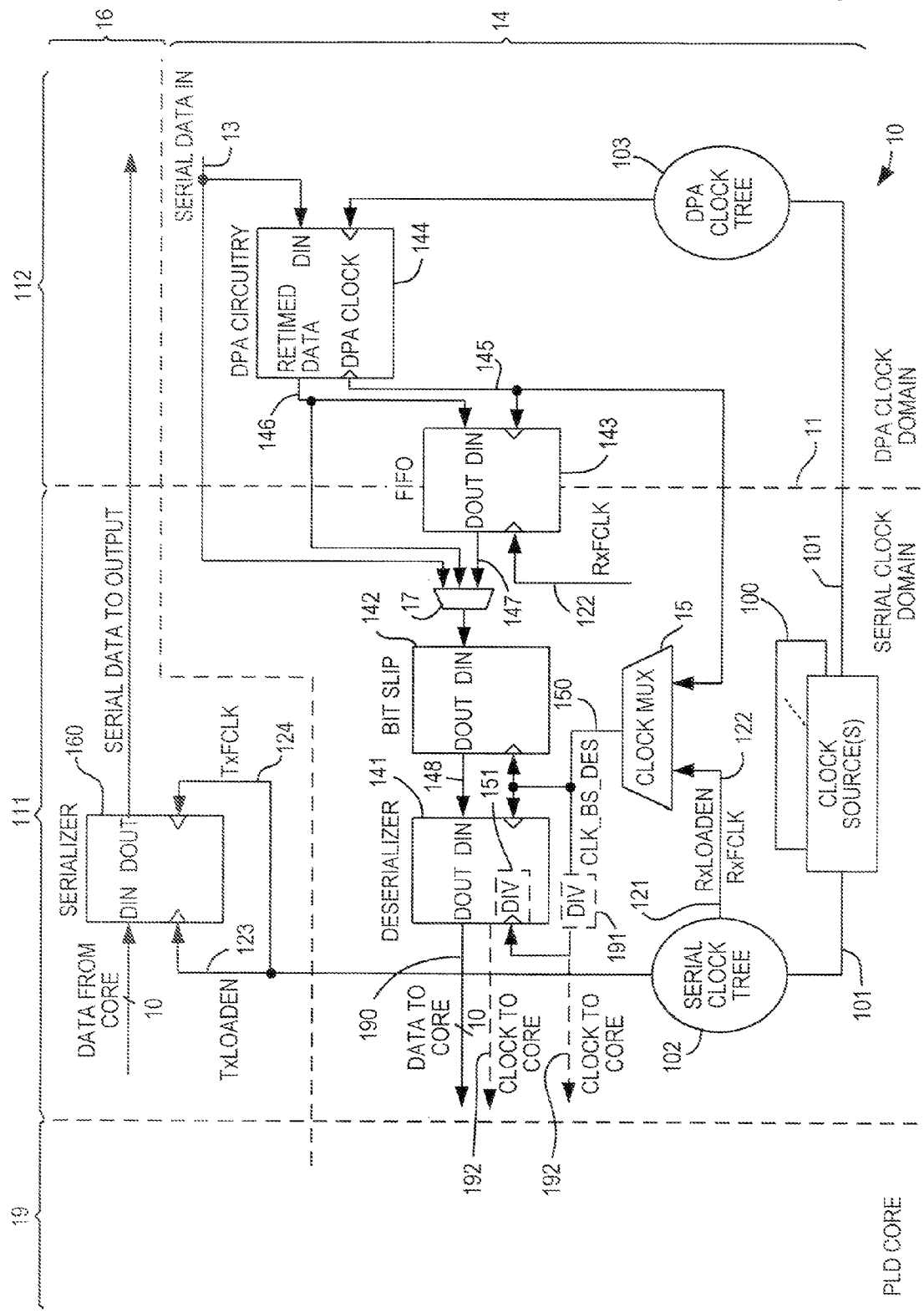
FIG. 1 is a block diagram of a preferred embodiment of a serial interface in accordance with the present invention.
Figure 2:
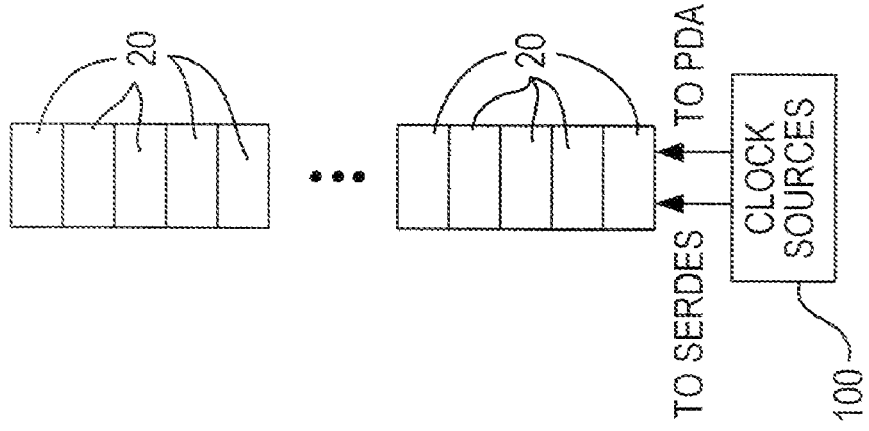
FIG. 2 is a schematic representation showing how several interfaces may be bonded to the same clock source.

FIG. 1 is a structural block diagram of a preferred embodiment of a high-speed serial interface 10 in accordance with the present invention. For purposes of this discussion, one can start with clock source(s) 100, which is/are at least a partial basis for clocks used in interface 10. As shown in FIG. 1, one or more clock sources 100 are illustrated as being part of interface 10. However, while that may be the case, clock sources 100 may be provided elsewhere on the PLD of which interface 10 is a part. Indeed, several interface channels 20 may be "bonded" to the same clock source(s) 100 as shown in FIG. 2. Clock sources preferably are loop circuits, and particularly phase-locked loop circuits (PLLs), although they may also be delay-locked loop circuits (DLLs).

Interface 10 may be considered as being divided into two different clock domains—serial clock domain 111 and DPA clock domain 112—divided in FIG. 1 by imaginary line 11.

In serial clock domain 111, the clock 101 output by clock source 100 preferably is used to derive at least the following four clocks: Receiver Load Enable Clock 121, Receiver Fast Clock 122, Transmitter Load Enable Clock 123 and Transmitter Fast Clock 124, which preferably are distributed through serial clock tree 102. Clocks 121-124 may be derived in clock tree 102, e.g., from incoming serial data using clock data recovery (CDR) techniques using clock(s) 101 as a reference clock. Alternatively, clocks 121-124 may be derived or selected from clock(s) 101 by any known technique. The receiver clocks 121, 122 preferably are distributed to one or more receive channels 14 (each including deserializer 141 AND bit slip module 142, as well as phase compensation FIFO 143 which may be considered to be in both serial clock domain 111 and DPA clock domain 112 as discussed below), while the transmit clocks 123, 124 preferably are distributed to the transmit channel 16 (including serializer 160). Receive channel(s) 14 and transmit channel 16 preferably operate simultaneously—i.e., in full duplex mode.

In DPA clock domain 112, the clock 101 output by clock source 100 preferably is used more directly. Specifically, clock 101 preferably is distributed by DPA clock tree 103 to one or more dynamic phase alignment modules 144 (each of which may be considered part of receive channel 14). As is well known—e.g., from commonly-assigned U.S. Pat. No. 7,138,837—in dynamic phase alignment, a plurality of phase-distributed candidate clock signals are provided, and the candidate clock signal closest in phase to another signal (e.g., a recovered clock signal or an incoming data signal) is selected. In a preferred embodiment of the present invention, the phase-distributed candidate clock signals may be, e.g., eight phases of a clock signal 101 from one of clock sources 100, separated by 45° of phase. The selected clock phase preferably is output as DPA clock 145.

DPA clock 145 preferably is used by DPA module 144 to align the phase of incoming data 13 to provide retimed data 146. Retimed data 146 may then pass through phase compensation FIFO 143 which preferably bridges both clock domains 111, 112 as described above, and which preferably delays data 146, if necessary, to compensate for phase differences between the DPA clock 145 and the clock used in serial clock domain 111 or in PLD core 19. The delayed data 147 then passes into serial clock domain 111 to bit slip module 142.

Alternatively, retimed data 146 may pass directly to bit slip module 142, or as a further alternative, input data 13 may pass directly to bit slip module 142 without passing through DPA module 144. The selection among input data 13, retimed data 146 or delayed data 147 may be made using a selector such as multiplexer 17.

Bit slip module 142 aligns the byte boundaries in the serial data (13, 146 or 147) as described, e.g., in commonly-assigned U.S. Pat. No. 6,724,328, which is hereby incorporated by reference herein in its entirety. The byte-aligned data 148 is then deserialized by deserializer 141 and sent as parallel data 190 to PLD core 19. Preferably, serial data 13 is encoded using 8B/10B encoding; therefore, data 190 is shown as 10-bit data. However, the number of bits per byte could be different.

Bit slip module 142 and the serial side of deserializer 141 preferably are clocked by bit-slip/deserializer clock 150 which may be selected by multiplexer 15 from among serial clocks 121, 122. The parallel side of deserializer 141 also preferably is clocked by clock 150, except that deserializer 141 preferably includes divider 151 which divides clock 150 by the number of bits per byte. Divider 151 preferably is programmable to change the bits-per-byte ratio, or "(de)serialization factor" (in this example, the deserialization factor is 10).

Although multiplexer 15 may select clock 150 from among the clocks derived from clock(s) 101, preferably interface 10, and particularly receive channel 14, also may operate in a soft-CDR mode in which the operative clock is not supplied externally or derived from external data (such as data 13). Rather, DPA clock 145, generated wholly internally by one of clock sources 100 and selected by DPA module 144 based on comparison with incoming serial data 13, is provided along with serial clocks 121, 122 as an input to multiplexer 15 and selected as the bit-slip/deserializer clock 150. As in the ordinary serial mode, divider 151 preferably divides this clock for use in deserializer 141.

Whether interface 10 is operating in the serial mode or the soft-CDR mode, the divided serial clock used in deserializer 141 is also useful in PLD core 19. Therefore, deserializer 141 may output the divided clock to PLD core 19 at 192. Alternatively, divider 151 may be provided outside deserializer 141, as at 191, with divided clock 192 provided to both deserializer 141 and PLD core 19. Although two dividers 151, 191 are shown (in phantom, as alternatives) in FIG. 1, preferably there is only one.

Each clock source 100 may be a loop circuit, such as a PLL, as described above, having a tuning range preferably between about 600 MHz and about 1.3 GHz. However, in some cases operation below 600 MHz may be desired. For example, DPA module 144 may operate between about 150 MHz and about 1.25 GHz. Thus, a portion (about 150 MHz to about 600 MHz) of the DPA clock range would not be supported by clock source 100. Therefore, in accordance with one preferred embodiment of the present invention, as shown in FIG. 3, dividers 31, 32 are provided in the output stage 30 of at least one of clock sources 100, to divide the output clock 102 (including all phases thereof), as output by voltage-controlled oscillator (VCO) 34 (in this embodiment, clock source 100 is a PLL of which VCO 34 is a part), by a factor of either 2 or 4, respectively. Preferably, multiplexer 33 chooses among the undivided clock 102 and the outputs of the two dividers 31, 32, to provide output clock 101.

Thus it is seen that a serial interface including a number of different features to handle the various issues that may arise with data rates over 1 Gbps and particularly over 1.25 Gbps, has been provided.

Figure 4:
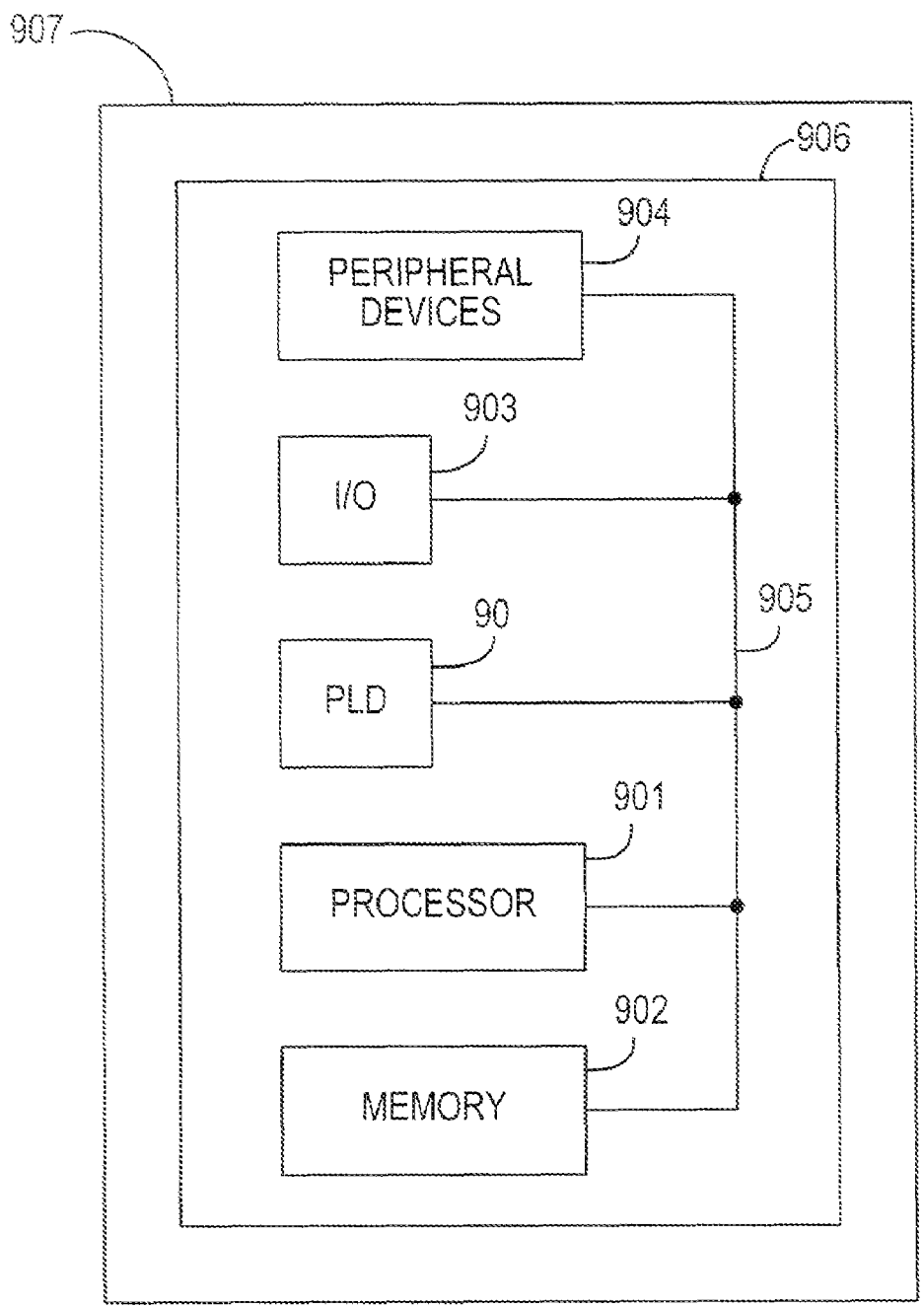
FIG. 4 is a simplified block diagram of an illustrative system employing a programmable logic device incorporating a serial interface in accordance with the present invention.

A PLD 90 incorporating the present invention may be used in many kinds of electronic devices. One possible use is in a data processing system 900 shown in FIG. 4. Data processing system 900 may include one or more of the following components: a processor 901; memory 902; I/O circuitry 903; and peripheral devices 904. These components are coupled together by a system bus 905 and are populated on a circuit board 906 which is contained in an end-user system 907.

System 900 can be used in a wide variety of applications, such as computer networking, data networking, instrumentation, video processing, digital signal processing, or any other application where the advantage of using programmable or reprogrammable logic is desirable. PLD 90 can be used to perform a variety of different logic functions. For example, PLD 90 can be configured as a processor or controller that works in cooperation with processor 901. PLD 90 may also be used as an arbiter for arbitrating access to shared resources in system 900. In yet another example, PLD 90 can be configured as an interface between processor 901 and one of the other components in system 900. It should be noted that system 900 is only exemplary, and that the true scope and spirit of the invention should be indicated by the following claims.

Various technologies can be used to implement PLDs 90 as described above and incorporating this invention.

It will be understood that the foregoing is only illustrative of the principles of the invention, and that various modifications can be made by those skilled in the art without departing from the scope and spirit of the invention, and the present invention is limited only by the claims that follow.

What is claimed is:

1. A serial data interface for use with a programmable logic device, said serial data interface being adapted to receive and deserialize a serial data signal, said serial data interface comprising:
   a clock source that provides a clocking signal having a plurality of phases;
   a dynamic phase alignment module that operates on serial data input to said interface and on said plurality of phases of said clocking signal to align said serial data with one of said phases of said clock signal to which it is closest in phase and to provide a phase-aligned data signal and to output said one of said phases as a phase-aligned clock signal;
   a clock tree module that derives a data clock using said clocking signal;
   serial data processing circuitry to deserialize said data signal based on an input clock signal; and
   a clock selector that selects one of said data clock and said phase-aligned clock signal as said input clock signal.

2. The serial data interface of claim 1 wherein said clock tree module includes a clock data recovery module that derives said data clock from said serial data signal.

3. The serial data interface of claim 1 wherein:
   said dynamic phase alignment module operates at a lower clock rate than said serial data processing circuitry; said serial data interface further comprising:
   clock dividing circuitry on an output of said clock source that divides each phase of said clocking signal by a division factor for use by said dynamic phase alignment module.

4. The serial data interface of claim 3 wherein said division factor is programmable.

5. The serial data interface of claim 4 wherein said clock dividing circuitry comprises:
   a plurality of dividers each of which divides said clocking signal by a respective factor; and
   a divider factor selector that programmably selects among said clocking signal and outputs of said plurality of dividers.

6. The serial data interface of claim 1 further comprising a phase compensation module between said dynamic phase alignment module and said serial data processing circuitry that delays said phase-aligned data signal, based on difference between said phase-aligned clock signal and said data clock, and outputs a delayed data signal.

7. The serial data interface of claim 6 further comprising a data selector that selects an input to said serial data processing circuitry from among said serial data signal, said phase-aligned data signal and said delayed data signal.

8. The serial data interface of claim 1 wherein said serial data processing circuitry comprises:
   byte alignment circuitry for aligning byte boundaries in said serial data signal; and
   deserializer circuitry for deserializing said byte aligned serial data signal.

9. The serial data interface of claim 1 further comprising:
   a serializer for converting parallel data to output serial data; wherein:
   said clock tree module further derives a serializer clock using said clocking signal.

10. The serial data interface of claim 9 wherein said serializer and said serial data processing circuitry operate substantially simultaneously in full duplex mode.

11. A programmable logic device comprising:
    a programmable logic core;
    a clock source that provides a clocking signal having a plurality of phases;
    at least one serial data interface being adapted to receive and deserialize a serial data signal, and to output said deserialized data signal to said programmable logic core, each said serial data interface comprising:
    a dynamic phase alignment module that operates on serial data input to said interface and on said plurality of phases of said clocking signal to align said serial data with one of said phases of said clocking signal to which it is closest in phase and to provide a phase-aligned data signal and to output said one of said phases as a phase-aligned clock signal,
    a clock tree module that derives a data clock using said clocking signal,
    serial data processing circuitry to deserialize said data signal based on an input clock signal, and
    a clock selector that selects one of said data clock and said phase-aligned clock signal as said input clock signal.

12. The programmable logic device of claim 11 wherein said clock tree module includes a clock data recovery module that derives said data clock from said serial data signal.

13. The programmable logic device of claim 11 wherein said clock source is included in said serial data interface.

14. The programmable logic device of claim 11 comprising a plurality of said serial data interfaces; wherein:
    said clock source is outside all said serial data interfaces; and
    at least two of said serial data interfaces are bonded to said clock source.

15. The programmable logic device of claim 11 wherein:
    said dynamic phase alignment module operates at a lower clock rate than said serial data processing circuitry; each said serial data interface further comprising:
    clock dividing circuitry on an output of said clock source that divides each phase of said clocking signal by a division factor for use by said dynamic phase alignment module.

16. The programmable logic device of claim 15 wherein said division factor is programmable.

17. The programmable logic device of claim 16 wherein said clock dividing circuitry comprises:
    a plurality of dividers each of which divides said clocking signal by a respective factor; and
    a divider factor selector that programmably selects among said clocking signal and outputs of said plurality of dividers.

18. The programmable logic device of claim 11 wherein each said serial data interface further comprises a phase compensation module between said dynamic phase alignment module and said serial data processing circuitry that delays said phase-aligned data signal, based on difference between said phase-aligned clock signal and said data clock, and outputs a delayed data signal.

19. The programmable logic device of claim 18 wherein each said serial data interface further comprises a data selector that selects an input to said serial data processing circuitry from among said serial data signal, said phase-aligned data signal and said delayed data signal.

20. The programmable logic device of claim 11 wherein said serial data processing circuitry comprises:
   byte alignment circuitry for aligning byte boundaries in said serial data signal; and
   deserializer circuitry for deserializing said byte aligned serial data signal.

21. The programmable logic device of claim 11 wherein each said serial data interface further comprises:
   a serializer for converting parallel data to output serial data; wherein:
   said clock tree module further derives a serializer clock using said clocking signal.

22. The programmable logic device of claim 21 wherein said serializer and said serial data processing circuitry operate substantially simultaneously in full duplex mode.

23. A serial data interface for use with a programmable logic device, said serial data interface being adapted to receive and deserialize a serial data signal, said serial data interface comprising:
   a clock source that provides a clocking signal having a plurality of phases;
   a dynamic phase alignment module that operates on serial data input to said interface and on said plurality of phases of said clocking signal to align said serial data with one of said phases of said clock signal to which it is closest in phase and to provide a phase-aligned data signal and to output said one of said phases as a phase-aligned clock signal;
   a clock tree module that derives a data clock using said clocking signal; and
   serial data processing circuitry to deserialize said data signal based on an input clock signal; wherein:
   said dynamic phase alignment module operates at a lower clock rate than said serial data processing circuitry; each said serial data interface further comprising:
   clock dividing circuitry on an output of said clock source that divides each phase of said clocking signal by a division factor for use by said dynamic phase alignment module.

24. The serial data interface of claim 23 wherein said clock tree module includes a clock data recovery module that derives said data clock from said serial data signal.

25. The serial data interface of claim 23 wherein said division factor is programmable.

26. The serial data interface of claim 25 wherein said clock dividing circuitry comprises:
   a plurality of dividers each of which divides said clocking signal by a respective factor; and
   a divider factor selector that programmably selects among said clocking signal and outputs of said plurality of dividers.

27. A programmable logic device comprising:
   a programmable logic core;
   a clock source that provides a clocking signal having a plurality of phases;
   at least one serial data interface being adapted to receive and deserialize a serial data signal, and to output said deserialized data signal to said programmable logic core, each said serial data interface comprising:
   a dynamic phase alignment module that operates on serial data input to said interface and on said plurality of phases of said clocking signal to align said serial data with one of said phases of said clock signal to which it is closest in phase and to provide a phase-aligned data signal and to output said one of said phases as a phase-aligned clock signal;
   a clock tree module that derives a data clock using said clocking signal; and
   serial data processing circuitry to deserialize said data signal based on an input clock signal; wherein:
   said dynamic phase alignment module operates at a lower clock rate than said serial data processing circuitry; each said serial data interface further comprising:
   clock dividing circuitry on an output of said clock source that divides each phase of said clocking signal by a division factor for use by said dynamic phase alignment module.

28. The programmable logic device of claim 27 wherein said clock tree module includes a clock data recovery module that derives said data clock from said serial data signal.

29. The programmable logic device of claim 27 wherein said clock source is included in said serial data interface.

30. The programmable logic device of claim 27 comprising a plurality of said serial data interfaces; wherein:
   said clock source is outside all said serial data interfaces; and
   at least two of said serial data interfaces are bonded to said clock source.

31. The serial data interface of claim 27 wherein said division factor is programmable.

32. The serial data interface of claim 31 wherein said clock dividing circuitry comprises:
   a plurality of dividers each of which divides said clocking signal by a respective factor; and
   a divider factor selector that programmably selects among said clocking signal and outputs of said plurality of dividers.

* * * * *